United States Patent

Tsunoda et al.

Patent Number: 6,002,153

Date of Patent: *Dec. 14, 1999

[54] MOS TYPE SEMICONDUCTOR DEVICE WITH A CURRENT DETECTING FUNCTION

[75] Inventors: Tetsujiro Tsunoda, Urawa; Takahiro Ito, Hyogo-ken; Masakatsu Takashita, Yokohama, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/760,806

[22] Filed: Dec. 5, 1996

[30] Foreign Application Priority Data

Dec. 7, 1995 [JP] Japan .................................. 7-319106

[51] Int. Cl.$^6$ ........................... H01L 29/76; H01L 29/94; H01L 31/062; H01L 29/74
[52] U.S. Cl. .......................... 257/341; 257/337; 257/339; 257/139
[58] Field of Search .................................... 257/341, 339, 257/328, 337, 467, 469; 307/139, 491

[56] References Cited

U.S. PATENT DOCUMENTS 5,281,872  1/1994  Mori .......................................... 307/491
5,365,085  11/1994 Tokura et al. ........................... 257/139

FOREIGN PATENT DOCUMENTS

56110265  1/1981  European Pat. Off. .
64000769  5/1989  European Pat. Off. .
0557126   8/1993  European Pat. Off. .
0649176   4/1995  European Pat. Off. .
0669658   8/1995  European Pat. Off. .

Primary Examiner—Steven H. Loke
Attorney, Agent, or Firm—Oblon, Spivak, McClelland, Maier & Neustadt, P.C.

[57] ABSTRACT

In an IGBT with a current sensing function having a plurality of principal current cells and at least one current sensing cell, a P-type base region of the current sensing cell in a current sensing cell region is formed larger than a P-type base region of the principal current cell in a principal current cell region. The IGBT is so constituted that the influence of temperature characteristic of parasitic resistor between the principal current cells and current sensing cell upon detected current can be eliminated and the same interval between the P-type base regions can be set for all the cells.

13 Claims, 5 Drawing Sheets

MOS TYPE SEMICONDUCTOR DEVICE WITH A CURRENT DETECTING FUNCTION

BACKGROUND OF THE INVENTION

1. Field of the Invention

The present invention relates to a vertical MOS type semiconductor device and, more particularly, to an IGBT (Insulated Gate Bipolar Transistor) with a current sensing function which is constituted of a plurality of principal current cells and at least one current sensing cell.

2. Description of the Related Art

In a prior art IGBT having a current sensing function, an external resistor is connected between a principal electrode and a current sensing electrode. The IGBT generally senses a current by detecting a difference in potential between the electrodes.

Figure 1:
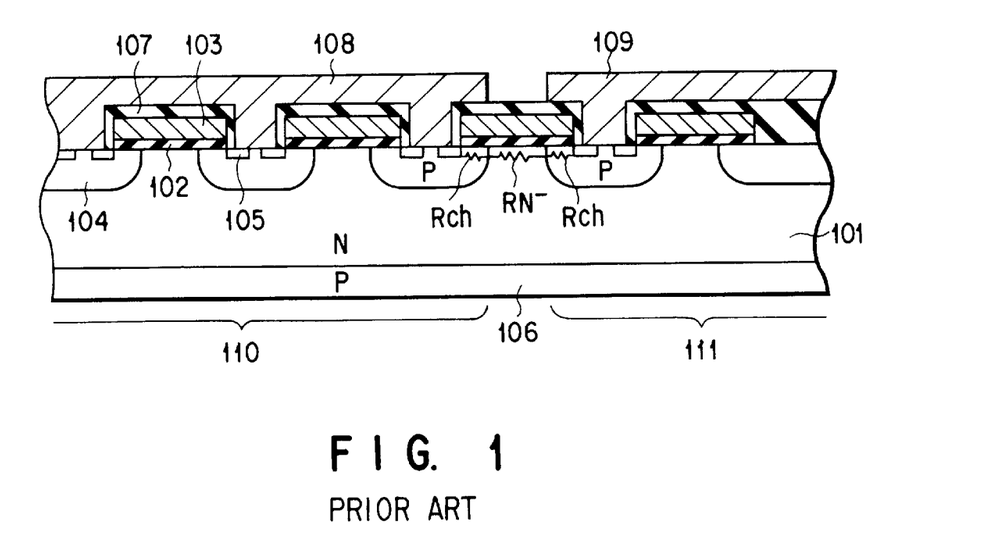
FIG. 1 is a cross-sectional view showing the structure of a prior art IGBT with a current sensing function in order to explain the problems of the IGBT.

FIG. 1 illustrates the structure of the prior art IGBT having a current sensing function. As illustrated in FIG. 1, a plurality of gate oxide films 102 are formed on one major surface of an N-type semiconductor layer 101, and a plurality of gate electrodes 103 are arranged on their respective gate oxide films 102. Each of P-type base regions 104 is formed between two gate electrodes 103 in the surface of the N-type semiconductor layer 101. Emitter regions 105 are provided in the surface portion of each of the P-type base regions 104. A P-type semiconductor layer 106 serving as a collector region is formed on the other major surface of the N-type semiconductor layer 101. Interlayer insulation films 107 are provided so as to cover the gate electrodes 103, and a principal electrode 108 and a current sensing electrode 109 are formed on the interlayer insulation films 107 and the one major surface of the N-type semiconductor substrate 101, thus completing a principal current cell region 110 and a current sensing cell region 111 arranged adjacent to each other.

In the IGBT described above, the width of the gate electrode 103 in each cell is constant, as is the interval between the gate electrodes 103. When a positive bias is applied to the gate electrode 103 in a normal current sensing state, the channel of a MOS gate (P-type base region 104 under the gate electrode 103) is inverted to an N type and thus the adjacent principal current cell region and current sensing cell region are connected to each other through an N drift region. Therefore, part of the current in the current sensing cell region 111, which is to flow through the external resistor (not shown), is caused to flow into the principal current cell region 110 through an internal parasitic resistor (resistive component $RN^-$ of the N-type semiconductor layer 101).

Since the above parasitic resistor is a bulk resistor formed by silicon, it has its own temperature characteristics and increases in resistance as the temperature rises, thus causing a problem wherein the current flowing through the external resistor increases as the temperature rises and the detected voltage (difference in potential between external resistors) heightens. In FIG. 1, Rch indicates a resistive component of the channel.

In order to resolve the above problem, an IGBT having a structure capable of lessening the influence of temperature characteristics of the parasitic resistor is contrived.

Figure 2:
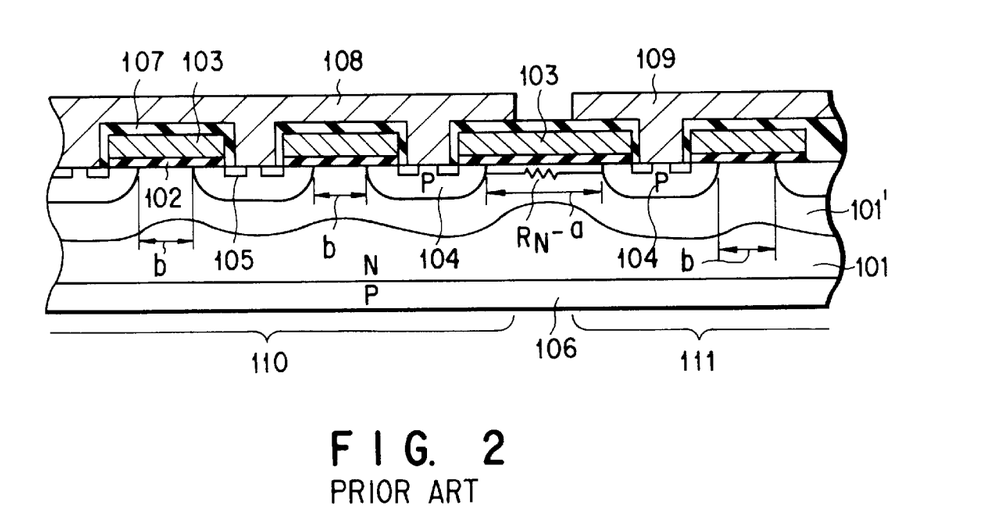
FIG. 2 is a cross-sectional view showing the structure of another prior art IGBT with a current sensing function.

FIG. 2 illustrates an IGBT which is so constituted that the value of a parasitic resistor is larger than that of an external resistor in order to lessen the influence of temperature characteristics of the parasitic resistor. In the IGBT, an interval a between adjacent P-type base regions 104 of the principal current cell 110 and current sensing cell 111, is greater than an interval b between other adjacent P-type base regions 104. More specifically, the width of a gate electrode 103 between the cells 110 and 111 is set greater than that of another gate electrode 103 (an interval between adjacent gate electrodes 103 is fixed), and the width of an N drift region connecting the adjacent cells 110 and 111 is increased. Thus, the value of a parasitic resistor (resistive component $RN^-$ of N-type semiconductor layer 101) is increased to improve the temperature characteristics.

However, the temperature characteristics of the parasitic resistor are slightly improved. Since, moreover, the curvature of a depletion layer 101' is acute in an area of the layer 101' where the interval a between the P-type base regions 104 is increased, a breakdown voltage is lowered. (See B. J. Baliga, "Modern Power Device", pp.272 to pp.274, for example.)

SUMMARY OF THE INVENTION

It is accordingly an object of the present invention to provide a semiconductor device which prevents a breakdown voltage from lowering and prevents a detected voltage from increasing due to the internal parasitic resistance heightened by the rise of temperature, thereby to improve in precision of current detection.

To attain the above object, according to a first aspect of the present invention, there is provided a vertical MOS type semiconductor device including a plurality of principal current cells and at least one current sensing cell, wherein a base region of at least one current sensing cell is formed larger than a base region of each of the plurality of principal current cells.

According to a second aspect of the present invention, there is provided a semiconductor device comprising:

a semiconductor layer of a first conductivity type;

first gate electrodes formed at regular intervals on the semiconductor layer;

at least one second gate electrode formed on the semiconductor layer, an interval between adjacent first gate electrodes being greater than an interval between one of the first gate electrodes and at least one second gate electrode;

first base regions of a second conductivity type selectively formed in a surface region of the semiconductor layer and between the first gate electrodes;

second base regions of the second conductivity type formed in the surface region of the semiconductor layer and between one of the first gate electrodes and at least one second gate electrode, the second base regions being larger than the first base regions;

source regions of the first conductivity type selectively formed in each of the first and second base regions;

a source electrode connected to the source regions formed in the first base regions; and a current sensing electrode connected to the source regions formed in the second base regions.

According to a third aspect of the present invention, there is provided a semiconductor device comprising:

a semiconductor layer of a first conductivity type;

first gate electrodes formed at regular intervals on the semiconductor layer;

at least one second gate electrode formed on the semiconductor layer, an interval between adjacent first gate electrodes being equal to an interval between one of the first gate electrodes and at least one second gate electrode;

first base regions of a second conductivity type selectively formed in a surface region of the semiconductor layer and between the first gate electrodes;

second base regions of the second conductivity type formed in the surface region of the semiconductor layer and between one of the first gate electrodes and at least one second gate electrode, the second base regions being larger than the first base regions;

source regions of the first conductivity type selectively formed in each of the first and second base regions;

a source electrode connected to the source regions formed in the first base regions; and a current sensing electrode connected to the source regions formed in the second base regions.

According to a fourth aspect of the present invention, there is provided a semiconductor device comprising:

a semiconductor layer of a first conductivity type;

first gate electrodes formed at regular intervals in a principal current cell region on one major surface of the semiconductor layer with gate insulation films therebetween;

at least one second gate electrode formed in a current sensing cell region on the one major surface of the semiconductor layer with gate insulation films therebetween, an interval between adjacent first gate electrodes being greater than an interval between one of the first gate electrodes and at least one second gate electrode;

first base regions of a second conductivity type selectively formed in a surface region of the semiconductor layer and between the first gate electrodes;

second base regions of the second conductivity type formed in the surface region of the semiconductor layer and between one of the first gate electrodes and at least one second gate electrode, the second base regions being larger than the first base regions;

emitter regions of the first conductivity type selectively formed in each of the first and second base regions;

a main electrode connected to the emitter regions formed in the first base regions;

a current sensing electrode connected to the emitter regions formed in the second base regions; and a collector layer of the second conductivity type formed on another major surface of the semiconductor layer.

According to a fifth aspect of the present invention, there is provided a semiconductor device comprising:

a semiconductor layer of a first conductivity type;

first gate electrodes formed at regular intervals in a principal current cell region on one major surface of the semiconductor layer with gate insulation films therebetween;

at least one second gate electrode formed in a current sensing cell region on the one major surface of the semiconductor layer with gate insulation films therebetween, an interval between adjacent first gate electrodes being equal to an interval between one of the first gate electrodes and at least one second gate electrode;

first base regions of a second conductivity type selectively formed in a surface region of the semiconductor layer and between the first gate electrodes;

second base regions of the second conductivity type formed in the surface region of the semiconductor layer and between one of the first gate electrodes and at least one second gate electrode, the second base regions being larger than the first base regions;

emitter regions of the first conductivity type selectively formed in each of the first and second base regions;

a main electrode connected to the emitter regions formed in the first base regions;

a current sensing electrode connected to the emitter regions formed in the second base regions; and a collector layer of the second conductivity type formed on another major surface of the semiconductor layer.

The semiconductor device according to the present invention is so constituted that the on-voltage in the principal current cell is heightened at a higher rate than that in the current sensing cell. Even when the temperature of the device is increased, the current obtained from the current sensing cell can be fixed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 3A:
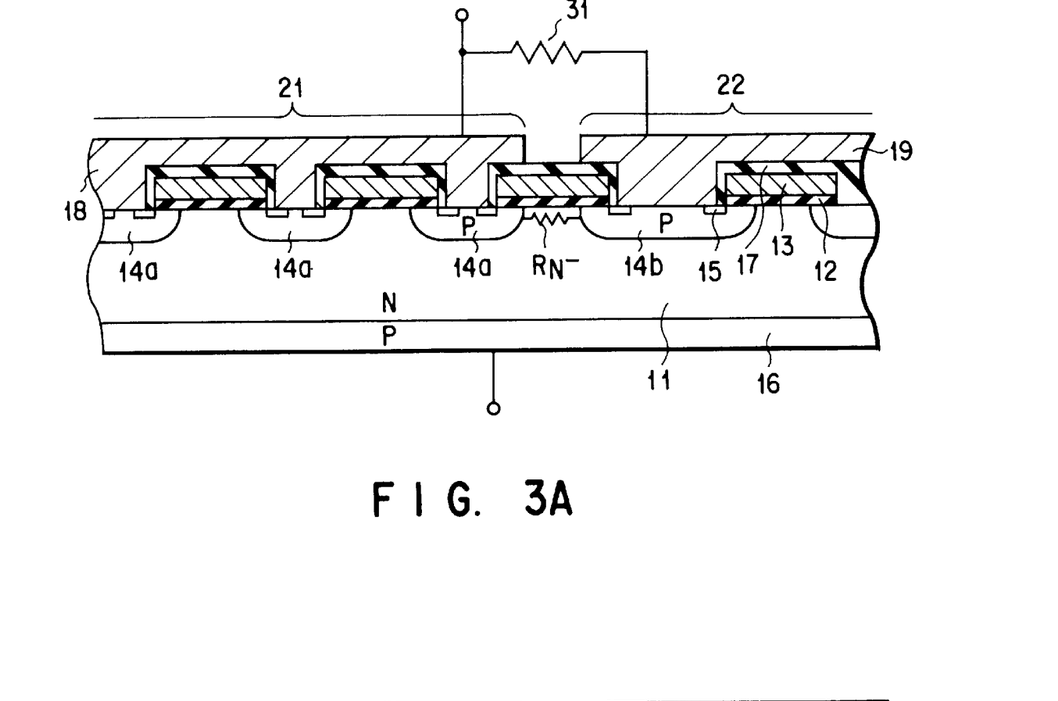
FIGS. 3A and 3B are illustrations of an IGBT with a current sensing function according to a first embodiment of the present invention.
Figure 3B:
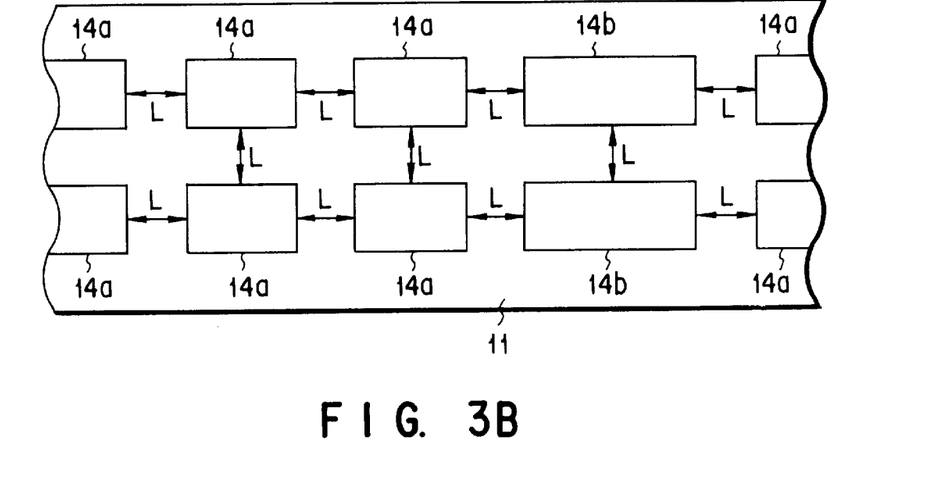

FIGS. 3A and 3B illustrate an IGBT (Insulated Gate Bipolar Transistor) with a current sensing function according to a first embodiment of the present invention. FIG. 3A is a cross-sectional view of the main part of the IGBT, while FIG. 3B is a plan view of an arrangement pattern of base regions of the IGBT of FIG. 3A.

In the IGBT, a plurality of gate electrodes 13 are arranged on the major surface of an N-type semiconductor layer 11 with their respective gate oxide films 12 therebetween. P-type base regions 14a and 14b are each formed on the surface of the N-type semiconductor layer 11 and between adjacent gate electrodes 13, by double diffusion using the gate electrodes 13 as masks. An emitter region 15 is selectively provided in the surface area of each of the P-type base regions 14a and 14b. A P-type semiconductor layer 16 serving as a collector region is formed on the other major surface of the N-type semiconductor layer 11. An interlayer insulation film 17 is formed so as to cover each of the gate electrodes 13, and a principal electrode 18, which is connected to both the P-type base region 14a and emitter region 15, and a current sensing electrode 19, which is connected to both the P-type base region 14b and emitter region 15, are formed on the major surface of the N-type semiconductor layer 11 with the interlayer insulation film 17 interposed therebetween. The IGBT is thus constituted of a principal current cell region 21 and a current sensing cell region 22 adjacent to each other.

One of the gate electrodes 13 is formed as an intermediate gate electrode (third gate electrode) between the principal current cell region 21 and the current sensing cell region 22, and is common to the cell regions 21 and 22. According to the IGBT of the first embodiment, the gate electrode (first gate electrode) 13 of a cell in the principal current cell region 21, the gate electrode (second gate electrode) 13 of a cell in the current sensing cell region 22, and the gate electrode 13 between the cell regions 21 and 22, have the same width.

On the other hand, the interval between the gate electrodes 13 of the cell in the principal current cell region 21 and that in the current sensing cell region 22 are different from each other. In other words, the latter interval is greater than the former.

It is natural that the widths of the respective P-type base regions 14a and 14b, which are to be formed using the gate electrodes 13 as masks, vary with the opening width of each of the masks, that is, the interval between the gate electrodes 13. The P-type base region 14b of the cell in the current detection cell region 22 is broader than the P-type base region 14a of the cell in the principal current cell region 21.

In the foregoing IGBT so constituted, since a parasitic resistor (resistive component of N-type semiconductor layer 11) RN⁻ is formed in an N drift region between a principal current cell and a current sensing cell adjacent to each other, the temperature characteristics of the parasitic resistor RN⁻ slightly influences the current detection, but the influence can almost be eliminated. In other words, the temperature characteristic of on-voltage (potential difference in the vertical direction of the principal current cell) in the principal current cell region 21 and that of on-voltage (potential difference in the vertical direction of the current sensing cell) in the current sensing cell region 22 can be caused to differ from each other by varying in width from P-type base region 14a to P-type base region 14b. Thus, when the temperature of the IGBT increases, the resistive components of current flowing through the current sensing cell can be made larger than those in the principal current cell thereby to prevent the current from increasing in the current sensing cell due to the temperature characteristic of the parasitic resistor RN⁻. Consequently, even though the temperature of the IGBT increases, the fixed amount of current obtained from the current sensing cell can be maintained, and the precision of current detection can be improved between external resistors 31.

Furthermore, in the IGBT of the first embodiment, the interval (L) between P-type base regions 14a and 14b is fixed for each cell (see FIG. 3B). Thus, the curvature of a depletion layer is not acute or the breakdown voltage is not lowered. In addition, the IGBT shown in FIG. 3A may include at least one current sensing cell 22 and a plurality of principle current cells 21 all having a same channel length.

Figure 4:
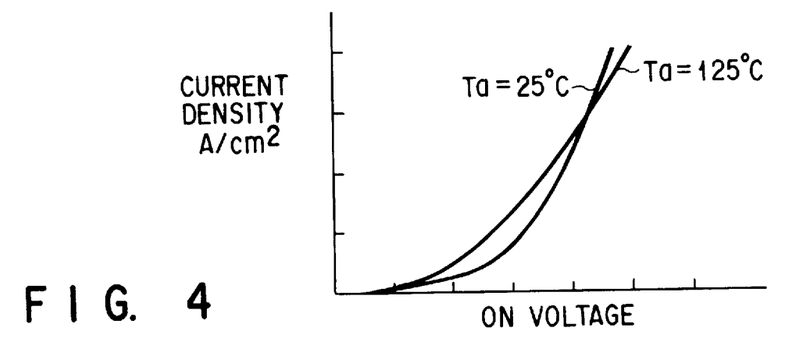
FIG. 4 is a graph of the relationship between current density and on-voltage in the principal current cell.

FIG. 4 shows the relationship between the current density and the on-voltage in the principal current cell. It is apparent from FIG. 4 that if the principal current cell has the above constitution, its on-voltage increases at a low rate even at a normal temperature (e.g., Ta=25° C.) and a high temperature (e.g., Ta=125° C.), and the on-voltage is not degraded too much.

Figure 5:
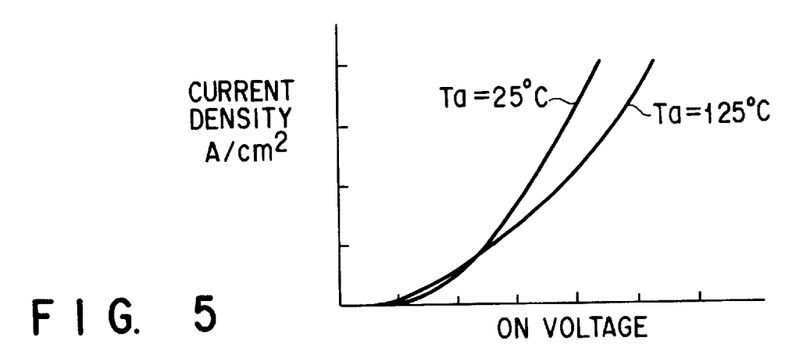
FIG. 5 is a graph of the relationship between current density and on-voltage in the current sensing cell.

FIG. 5 shows the relationship between the current density and the on-voltage in the current sensing cell. It is apparent from FIG. 5 that if the current sensing cell has the above constitution, its on-voltage increases at a higher rate than the on-voltage of the principal current cell at the high temperature. It is thus understood that the resistance of current flowing through the current sensing cell is easy to increase.

The channel width of a MOS gate per unit area (an overlap of the P-type base region with the gate electrode) in the principal current cell is greater than that in the current sensing cell and accordingly, the base current to be supplied to the PNP transistor is increased, with the result that the on-voltage is prevented from increasing at a high rate even while the temperature is high and so is the current density.

As described above, according to the first embodiment of the present invention, the influence of temperature characteristics of parasitic resistor RN⁻ between the principal current cell and current sensing cell upon current detection can be eliminated by varying in structure from the former cell to the latter cell. More specifically, the temperature of the IGBT at which the on-voltage of the current sensing cell is zero is set higher than that at which the on-voltage of the principal current cell is zero. Thus, when the temperature of the IGBT rises and the current density increases, the increase rate of on-voltage in the current sensing cell is higher than that in the principal current cell. Since the decrease rate of current in the current sensing cell is higher when the temperature of the IGBT increases, the increase in current in the current sensing cell, which is caused by the temperature characteristic of parasitic resistor RN⁻, can be prevented.

Figure 6:
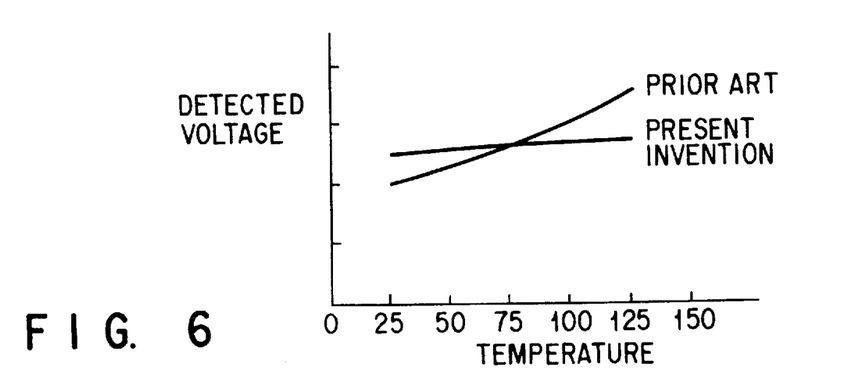
FIG. 6 is a graph of the relationship between detected voltage and temperature in both the IGBT of the first embodiment and the prior art IGBT.

FIG. 6 shows the relationship between the detected voltage and the temperature in both the IGBT of the first embodiment and the prior art IGBT. As described above, in the first embodiment, an influence of temperature characteristic of parasitic resistor RN⁻ between the principal current cell and current sensing cell upon current detection, can be eliminated. Furthermore, the interval (L) between the P-type base regions is fixed for each of the cells. Thus, even when the temperature of the IGBT rises, a detected voltage can be prevented from being heightened due to an increase in value of the internal parasitic resistor RN⁻, and the precision of current detection can be improved without decreasing in breakdown voltage.

In the above-described first embodiment of the present invention, the principal current cell region 21 and current sensing cell region 22 differ from each other in interval between gate electrodes 13, the P-type base regions 14a and 14b are formed by double diffusion using the gate electrodes 13 as masks, and the P-type base region 14b in the current sensing cell region 22 is wider than the P-type base region 14a in the principal current cell region 21. However, the present invention is not limited to the constitution of the first embodiment. For example, even though the channel length of the cell in the current sensing cell region 22 is set greater than that in the principal current cell region 21, the same advantage can be expected.

Figure 7:
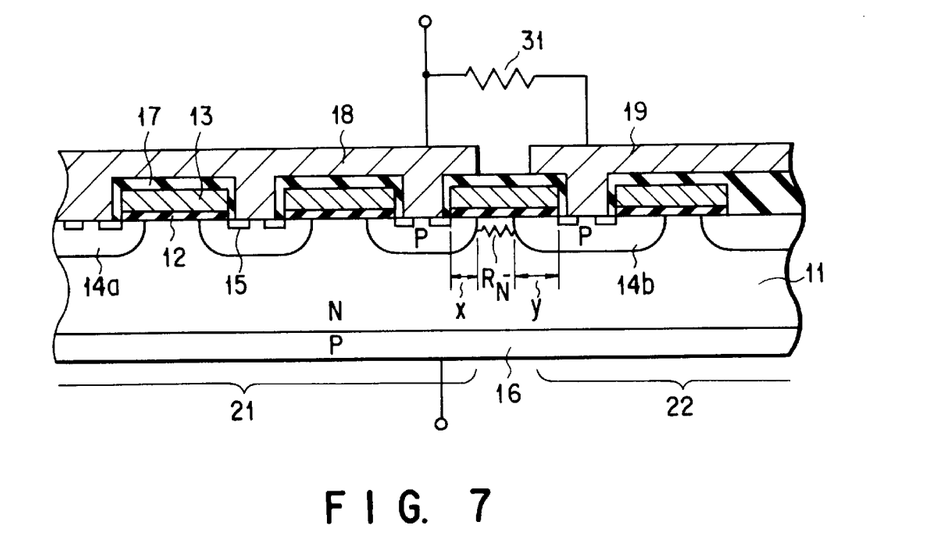
FIG. 7 is an illustration of an IGBT with a current sensing function according to a second embodiment of the present invention.

FIG. 7 illustrates an IGBT with a current sensing function according to a second embodiment of the present invention. In the IGBT of the second embodiment, the widths of gate electrodes 13 of cells both in a principal current cell region 21 and in a current sensing region 22 are the same, as is the interval between adjacent gate electrodes 13 in both the regions, whereas the cells vary in channel length from region 21 to region 22. (The depths of P-type base regions 14a and 14b are the same.) Specifically, the channel length y of the cell of the current sensing cell region 22 is greater than the channel length x of the cell of the principal current cell region 21.

To make the peak densities of impurities almost equal to each other on the channel surfaces of the cells in both the regions 21 and 22, for example, the impurities are implanted in advance into that portion of an N-type semiconductor layer 11 where a long channel is to be formed before the gate electrode 13 is formed, and then diffused by double diffusion using the gate electrode 13 as a mask at the same time when the P-type base regions 14a and 14b are formed.

According to the IGBT having the constitution described above, since the base current supplied to a PNP transistor in the principal current cell is larger than that in the current sensing cell, the PNP transistor in the principal current cell region 21 becomes dominant, with the result that the on-voltage is prevented from increasing while the temperature of the IGBT and the density of the current are high. In this constitution, however, the value of parasitic resistor RN⁻ becomes smaller as the channel length y increases, so that there is a fear of a slight influence upon current detection, but the precision of the current detection can be improved in substantially the same manner as in the first embodiment.

Figure 8:
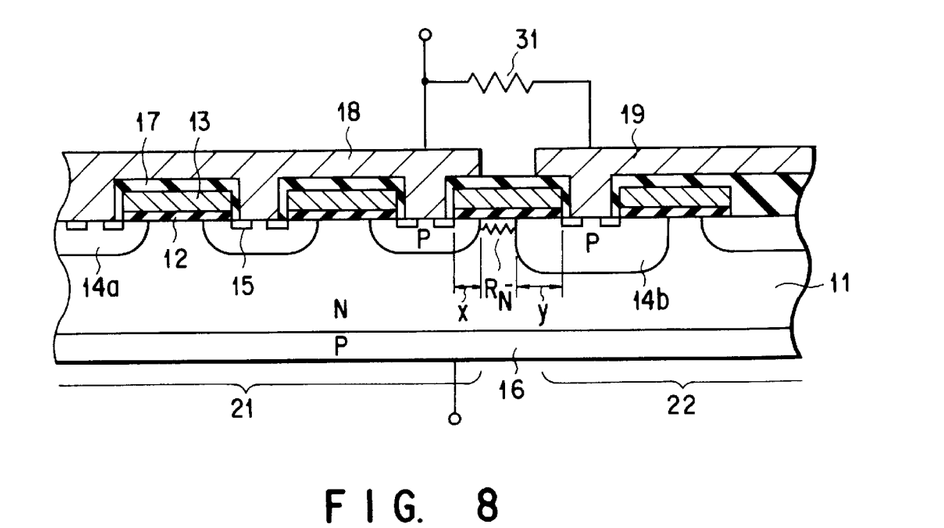
FIG. 8 is an illustration of an IGBT with a current sensing function according to a third embodiment of the present invention.

FIG. 8 illustrates an IGBT with a current sensing function according to a third embodiment of the present invention. The IGBT of the third embodiment is so constituted that P-type base regions 14a and 14b of the principal current cell region 21 and current sensing cell region 22 differ from each other in depth as well as in channel length. More specifically, the P-type base region 14b is expanded such that the channel length y of the cell thereof is greater than the channel length x of the cell of the P-type base region 14a.

To easily achieve the same peak density of impurities on the channel surfaces of the cells in both the regions 21 and 22, for example, the P-type base regions 14a and 14b are formed separately, using the gate electrodes 13 as masks, by varying the impurities in amount.

Almost the same advantage as that of the second embodiment can be expected even in the above constitution of the third embodiment. Though there is a fear of a slight influence of the decrease in parasitic resistor RN⁻, the IGBT of the third embodiment can be improved in precision of current detection.

Figure 9:
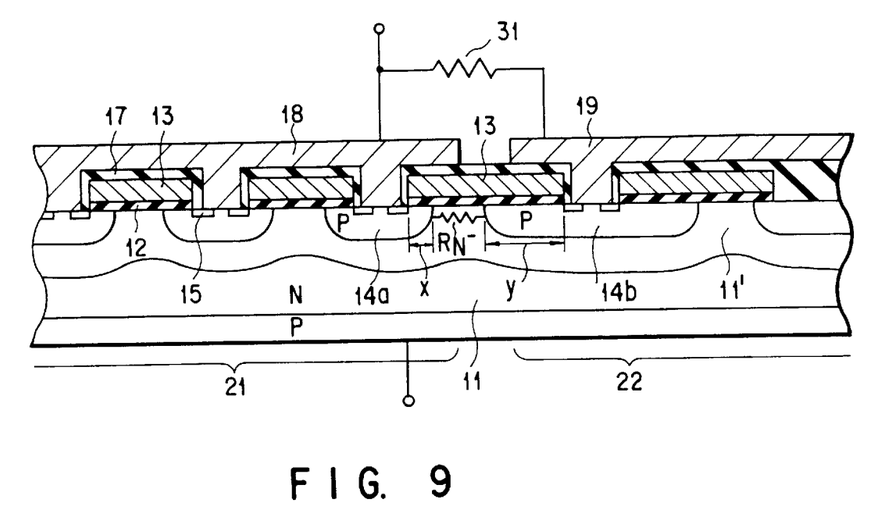
FIG. 9 is an illustration of an IGBT with a current sensing function according to a fourth embodiment of the present invention.

FIG. 9 illustrates an IGBT with a current sensing function according to a fourth embodiment of the present invention. In the IGBT of the fourth embodiment, the width of a gate electrode 13 formed between a principal current cell region 21 and a current sensing cell region 22 is greater than at least the width of each of gate electrodes 13 formed in the cell region 21. A P-type base region 14b is extended so that portion of a drift region, connecting adjacent cells of the regions 21 and 22, which is formed directly under the gate electrode 13 and expanded by expanding the gate electrode 13. In other words, the channel length y of the cell of the current sensing cell region 22 is set longer than the channel length x of the cell of the principal current cell region 21, thereby fixing the interval between the P-type base regions 14a and 14b.

For example, as in the case of the foregoing second embodiment, the impurities are implanted in advance into that portion of an N-type semiconductor layer where a long channel is to be provided before the gate electrode 13 is formed, and then diffused by double diffusion using the gate electrode 13 as a mask at the same time when the P-type base regions 14a and 14b are formed. It is thus possible to maintain substantially the same peak density of impurities on the channel surfaces of cells in both the cell regions 21 and 22.

As in the IGBT of the second embodiment, since the base current supplied to a PNP transistor in the principal current cell is larger than that in the current sensing cell, the PNP transistor in the principal current cell region 21 becomes dominant, with the result that the on-voltage is prevented from increasing while the temperature of the IGBT and the density of the current are high. Furthermore, the parasitic resistor RN⁻ is not decreased in value unlike in the second and third embodiments, and the same advantage as that of the first embodiment can be expected even in the above constitution of the fourth embodiment. More specifically, the current sensed by the current sensing cell can be kept to a constant value even when the temperature of the IGBT increases, and the precision of current detection between external resistors 31 can be improved. Since, moreover, the interval between the P-type base regions 14a and 14b is fixed, the curvature of a depletion layer 11' is not acute or the breakdown voltage is not lowered.

Figure 10:
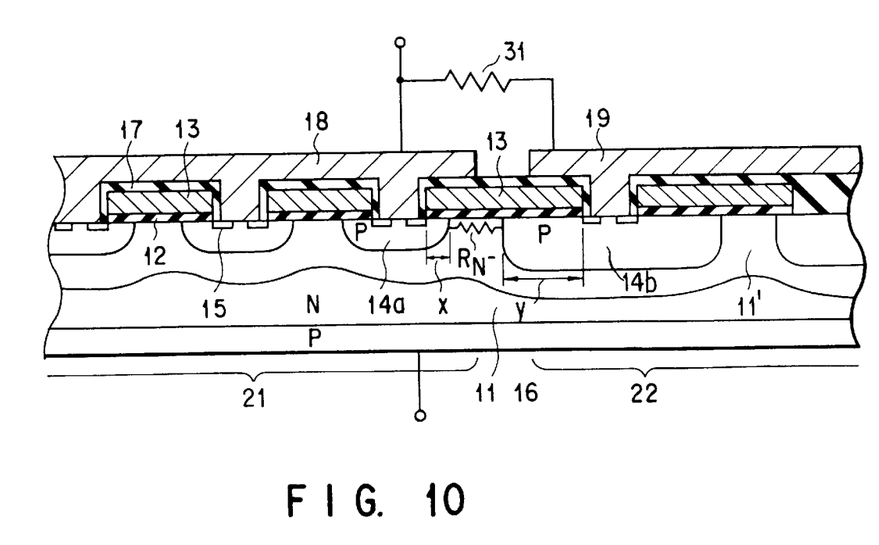
FIG. 10 is an illustration of an IGBT with a current sensing function according to a fifth embodiment of the present invention.

FIG. 10 illustrates an IGBT with a current sensing function according to a fifth embodiment of the present invention. In the IGBT of the fifth embodiment, a gate electrode 13 formed between a principal current cell region 21 and a current sensing cell region 22 is increased in width (the intervals between adjacent gate electrodes 13 are the same), the channel length y of the cell of the cell region 22 directly under the gate electrode 13, is greater than the channel length x of the cell of the cell region 21, and P-type base regions 14a and 14b are arranged so as to maintain a regular interval therebetween. More specifically, the P-type base region 14b is formed such that it extends to that portion of an N drift region, connecting adjacent cells of the regions 21 and 22, which is increased by the increased width of the gate electrode 13.

As in the case of the foregoing third embodiment, since the P-type base regions 14a and 14b are formed separately by varying impurities in amount, using the gate electrodes 13 as masks, the peak densities of the impurities on the channel surfaces of the cells of the cell regions 21 and 22 can be substantially the same.

Even in the fifth embodiment having the above constitution, almost the same advantage as that of the fourth embodiment can be expected. That is, the parasitic resistor is not decreased in value, but the precision of current detection is improved.

The IGBT with a current sensing function has been described as an example of the present invention in the above first to fifth embodiments. However, the present invention is not limited to the IGBT, but can be applied to various types of semiconductor device having a normal vertical MOS structure.

The number of current sensing cells is not limited to one. The IGBT can be provided with a plurality of cells.

It is needless to say that various changes and modifications can be made without departing from the scope of the subject matter of the present invention.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor layer of a first conductivity type;
   a plurality of first gate electrodes arranged on said semiconductor layer at a first interval;
   a third gate electrode formed adjacent to one of said plurality of first gate electrodes and arranged on said semiconductor layer at the first interval;
   at least one second gate electrode formed adjacent to said third gate electrode and arranged on said semiconductor layer at a second interval which is greater than the first interval;
   a first base region of a second conductivity type selectively formed in a surface region of said semiconductor layer between adjacent first gate electrodes and between said first gate electrode and said third gate electrode;
   a second base region of the second conductivity type formed in the surface region of said semiconductor layer between said third gate electrode and said at least one second gate electrode, at least a width of said second base region being larger than that of said first base region;
   a source region of the first conductivity type selectively formed in each of said first base region and said second base region;
   a source electrode connected to both said first base region and said source region formed in said first base region; and
   a current sensing electrode connected to both said second base region and said source region formed in said second base region.

2. The semiconductor device according to claim 1, wherein each of said plurality of first gate electrodes, said at least one second gate electrode and said third gate electrode have substantially the same width.

3. The semiconductor device according to claim 1, wherein a channel of at least said first base region formed directly under said third gate electrode has a length which is substantially equal to that of a channel of said second base region formed directly under said third gate electrode.

4. The semiconductor device according to claim 1, wherein an interval between adjacent first base regions is substantially equal to an interval between adjacent first base region and second base region.

5. A semiconductor device comprising:
   a semiconductor layer of a first conductivity type;
   a plurality of first gate electrodes arranged on said semiconductor layer at a first interval;
   a third gate electrode formed adjacent to one of said plurality of first gate electrodes and arranged on said semiconductor layer at the first interval;
   at least one second gate electrode formed adjacent to said third gate electrode and arranged on said semiconductor layer at a same interval as the first interval;
   a first base region of a second conductivity type selectively formed in a surface region of said semiconductor layer between adjacent first gate electrodes and between said first gate electrode and said third gate electrode;
   a second base region of the second conductivity type formed in the surface region of said semiconductor layer between said third gate electrode and said at least one second gate electrode, at least a width of said second base region being larger than that of said first base region, wherein said second base region comprises an active cell;
   a source region of the first conductivity type selectively formed in each of said first base region and said second base region;
   a source electrode connected to both said first base region and said source region formed in said first base region; and
   a current sensing electrode connected to both said second base region and said source region formed in said second base region,
   wherein each of said plurality of first gate electrodes, said at least one second gate electrode and said third gate electrode have substantially the same width.

6. A semiconductor device comprising:
   a semiconductor layer of a first conductivity type;
   a plurality of first gate electrodes arranged on said semiconductor layer at a first interval;
   a third gate electrode formed adjacent to one of said plurality of first gate electrodes and arranged on said semiconductor layer at the first interval;
   at least one second gate electrode formed adjacent to said third gate electrode and arranged on said semiconductor layer at a same interval as the first interval;
   a first base region of a second conductivity type selectively formed in a surface region of said semiconductor layer between adjacent first gate electrodes and between said first gate electrode and said third gate electrode;
   a second base region of the second conductivity type formed in the surface region of said semiconductor layer between said third gate electrode and said at least one second gate electrode, at least a width of said second base region being larger than that of said first base region, wherein said second base region comprises an active cell;
   a source region of the first conductivity type selectively formed in each of said first base region and said second base region;
   a source electrode connected to both said first base region and said source region formed in said first base region; and
   a current sensing electrode connected to both said second base region and said source region formed in said second base region,
   wherein said at least one second gate electrode and said third gate electrode each have a width which is larger than that of each of said plurality of first gate electrodes.

7. A semiconductor device comprising:

a semiconductor layer of a first conductivity type;

a plurality of first gate electrodes arranged on said semiconductor layer at a first interval;

a third gate electrode formed adjacent to one of said plurality of first gate electrodes and arranged on said semiconductor layer at the first interval;

at least one second gate electrode formed adjacent to said third gate electrode and arranged on said semiconductor layer at a same interval as the first interval;

a first base region of a second conductivity type selectively formed in a surface region of said semiconductor layer between adjacent first gate electrodes and between said first gate electrode and said third gate electrode;

a second base region of the second conductivity type formed in the surface region of said semiconductor layer between said third gate electrode and said at least one second gate electrode, at least a width of said second base region being larger than that of said first base region, wherein said second base region comprises an active cell;

a source region of the first conductivity type selectively formed in each of said first base region and said second base region;

a source electrode connected to both said first base region and said source region formed in said first base region; and a current sensing electrode connected to both said second base region and said source region formed in said second base region, wherein a channel of said second base region formed directly under said third gate electrode has a length which is greater than that of a channel of at least said first base region formed directly under said third gate electrode.

8. A semiconductor device comprising:

a semiconductor layer of a first conductivity type;

a plurality of first gate electrodes arranged at a first interval in a principal current cell region on one major surface of said semiconductor layer, a first gate insulation film being interposed between each of said plurality of first gate electrodes and said principal current cell region;

at least one second gate electrode formed adjacent to a third gate electrode and arranged on said semiconductor layer at a second interval, which is greater than the first interval, in a current sensing cell region adjacent to said principal current cell region on the one major surface of said semiconductor layer, a second gate insulation film being interposed between said at least one second gate electrode and said current sensing cell region;

said third gate electrode formed adjacent to one of said plurality of first gate electrodes and arranged on the major surface of said semiconductor layer at the first interval, and between the principal current cell region and the current sensing cell region, a third gate insulation film being interposed between said third gate electrode and the major surface of said semiconductor layer;

a first base region of a second conductivity type selectively formed in a surface region of said semiconductor layer between adjacent first gate electrodes and between said first gate electrode and said third gate electrode;

a second base region of the second conductivity type formed in the surface region of said semiconductor layer between said third gate electrode and said at least one second gate electrode, at least a width of said second base region being larger than that of said first base region;

an emitter region of the first conductivity type selectively formed in each of said first base region and said second base region;

a main electrode connected to both said first base region and said emitter region formed in said first base region;

a current sensing electrode connected to both said second base region and said emitter region formed in said second base region; and a collector layer of the second conductivity type formed on another major surface of said semiconductor layer.

9. The semiconductor device according to claim 8, wherein each of said plurality of first gate electrodes, said at least one second gate electrode and said third gate electrode have substantially the same width.

10. The semiconductor device according to claim 8, wherein a channel formed within the principal current cell region and a channel formed within the current sensing cell region have substantially the same length.

11. The semiconductor device according to claim 8, wherein an interval between adjacent first base regions is substantially equal to an interval between adjacent first base region and second base region.

12. A semiconductor device comprising:

a semiconductor layer of a first conductivity type;

a plurality of first gate electrodes arranged at a first interval in a principal current cell region on one major surface of said semiconductor layer, a first gate insulation film being interposed between each of said plurality of first gate electrodes and said principal current cell region;

at least one second gate electrode formed adjacent to a third gate electrode and arranged on said semiconductor layer at a second interval in a current sensing cell region adjacent to said principal current cell region on the one major surface of said semiconductor layer, a second gate insulation film being interposed between said at least one second gate electrode and said current sensing cell region, wherein the second interval is the same as the first interval;

said third gate electrode formed adjacent to one of said plurality of first gate electrodes and arranged on the major surface of said semiconductor layer at the first interval and between the principal current cell region and the current sensing cell region, a third gate insulation film being interposed between said third gate electrode and the major surface of said semiconductor layer;

a first base region of a second conductivity type selectively formed in a surface region of said semiconductor layer between adjacent first gate electrodes and between said first gate electrode and said third gate electrode;

a second base region of the second conductivity type formed in the surface region of said semiconductor layer between said third gate electrode and said at least one second gate electrode, at least a width of said second base region being larger than that of said first base region, wherein said second base region comprises an active cell;

an emitter region of the first conductivity type selectively formed in each of said first base region and said second base region;

a main electrode connected to both said first base region and said emitter region formed in said first base region;

a current sensing electrode connected to both said second base region and said emitter region formed in said second base region; and a collector layer of the second conductivity type formed on another major surface of said semiconductor layer, wherein each of said plurality of first gate electrodes, said at least one second gate electrode and said third gate electrode have substantially the same width.

13. A semiconductor device comprising:

a semiconductor layer of a first conductivity type;

a plurality of first gate electrodes arranged at a first interval in a principal current cell region on one major surface of said semiconductor layer, a first gate insulation film being interposed between each of said plurality of first gate electrodes and said principal current cell region;

at least one second gate electrode formed adjacent to a third gate electrode and arranged on said semiconductor layer at a second interval in a current sensing cell region adjacent to said principal current cell region on the one major surface of said semiconductor layer, a second gate insulation film being interposed between said at least one second gate electrode and said current sensing cell region, wherein the second interval is the same as the first interval;

said third gate electrode formed adjacent to one of said plurality of first gate electrodes and arranged on the major surface of said semiconductor layer at the first interval and between the principal current cell region and the current sensing cell region, a third gate insulation film being interposed between said third gate electrode and the major surface of said semiconductor layer;

a first base region of a second conductivity type selectively formed in a surface region of said semiconductor layer between adjacent first gate electrodes and between said first gate electrode and said third gate electrode;

a second base region of the second conductivity type formed in the surface region of said semiconductor layer between said third gate electrode and said at least one second gate electrode, at least a width of said second base region being larger than that of said first base region, wherein said second base region comprises an active cell;

an emitter region of the first conductivity type selectively formed in each of said first base region and said second base region;

a main electrode connected to both said first base region and said emitter region formed in said first base region;

a current sensing electrode connected to both said second base region and said emitter region formed in said second base region; and a collector layer of the second conductivity type formed on another major surface of said semiconductor layer, wherein said at least one second gate electrode and said third gate electrode each have a width which is larger than that of each of said plurality of first gate electrodes.

* * * * *